United States Patent
Tanaka et al.

(10) Patent No.: US 7,702,475 B2
(45) Date of Patent: Apr. 20, 2010

(54) METHOD FOR INSPECTING ELECTRICAL CHARACTERISTICS OF CHIPS AND A STORAGE MEDIUM FOR STORING A PROGRAM OF THE METHOD

(75) Inventors: Hideaki Tanaka, Nirasaki (JP); Toshiaki Akasaka, Nirasaki (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 12/126,466

(22) Filed: May 23, 2008

(65) Prior Publication Data
US 2009/0002011 A1 Jan. 1, 2009

(30) Foreign Application Priority Data
Jun. 29, 2007 (JP) .............................. 2007-173106

(51) Int. Cl.
*G01R 31/02* (2006.01)
*G06F 11/273* (2006.01)
(52) U.S. Cl. .............................. 702/83; 702/81; 702/84; 324/758
(58) Field of Classification Search .................. 702/83, 702/81, 84
See application file for complete search history.

(56) References Cited

U.S. PATENT DOCUMENTS

| 5,777,485 | A  | * | 7/1998 | Tanaka et al. | ............... | 324/757 |
| 2005/0083073 | A1 | * | 4/2005 | Nihei et al. | ................. | 324/758 |
| 2006/0192575 | A1 | * | 8/2006 | Kasukabe et al. | ........... | 324/754 |
| 2008/0197869 | A1 | * | 8/2008 | Miyagi et al. | ............... | 324/762 |
| 2009/0128178 | A1 |   | 5/2009 | Matsuzawa |   |   |

FOREIGN PATENT DOCUMENTS
JP 2007-088203 4/2007

* cited by examiner

*Primary Examiner*—Hal D Wachsman
(74) *Attorney, Agent, or Firm*—Oblon, Spivak, McClelland, Maier & Neustadt, L.L.P.

(57) ABSTRACT

An inspecting method includes registering a pre-obtained relationship between contact time of probes with a target object having a predetermined temperature and tip positions of the probes which vary in accordance with the contact time. The method further includes inspecting one or more chips at a time by estimating the tip positions of the probes based on the relationship and the contact time of the probes with the one or more chips and then correcting the tip positions of the probes from previous tip positions based on the estimated tip positions until the probes are stable without being extended or contracted.

8 Claims, 5 Drawing Sheets

METHOD FOR INSPECTING ELECTRICAL CHARACTERISTICS OF CHIPS AND A STORAGE MEDIUM FOR STORING A PROGRAM OF THE METHOD

CROSS REFERENCE TO RELATED APPLICATIONS

This application is based upon and claims the benefit of priority to Japanese Patent Application No. 2007-173106, filed on Jun. 29, 2007, which is incorporated herein by reference.

FIELD OF THE INVENTION

The present invention relates to an inspecting method using a probe apparatus; and, more particularly, to an inspecting method for performing high-temperature inspection as well as low-temperature inspection by using a probe apparatus without heating or cooling a probe card in advance to thereby increase an operating efficiency, and a storage medium storing a program of the method.

BACKGROUND OF THE INVENTION

A conventional probe apparatus includes: a loader chamber for transferring a target object to be inspected such as a semiconductor wafer or the like; a prober chamber for inspecting electrical characteristics of the target object transferred from the loader chamber; and a control unit for controlling the loader chamber and the prober chamber. The conventional probe apparatus serves to transfer the target object from the loader chamber to the prober chamber, inspect the electrical characteristics of the target object in the prober chamber, and return the inspected target object to the original location, under the control of the control unit.

The prober chamber has: a mounting table accommodating therein an elevation mechanism, for mounting thereon the target object; an XY table for moving the mounting table in X and Y directions; a probe card disposed above the mounting table moving by the XY table; and an alignment mechanism for aligning a plurality of probes of the probe card with a plurality of electrode pads of the target object mounted on the mounting table. The inspection is performed while keeping the target object mounted on the mounting table at a predetermined temperature by a temperature control unit installed in the mounting table. Moreover, a test head is rotatably provided on a top surface of the prober chamber, and is electrically connected to the probe card through a performance board (not shown).

The probe apparatus performs high-temperature inspection by heating the target object to a high temperature of, e.g., about 100° C. or higher, or low-temperature inspection by cooling the target object to, e.g., several tens of minus degrees. When the high- or the low-temperature inspection is carried out, the target object is heated or cooled to a predetermined inspection temperature by using the temperature control unit installed in the mounting table. The temperature control unit has a heating unit and a cooling unit.

For example, when the target object is subjected to the high-temperature inspection, the target object mounted on the mounting table is heated to, e.g., about 100° C., by using the temperature control unit installed in the mounting table. Next, the probes of the probe card are aligned with the target object by the alignment mechanism, and are then brought into contact with the target object. Thereafter, the target object is overdriven to inspect electrical characteristics of the target object at a temperature of about 100° C.

In an initial stage of the inspection, the target object is heated to a high temperature of about 100° C., whereas the probe card is not heated. Therefore, a large temperature difference exists between the target object and the probes. Accordingly, when the probes are brought into contact with a first chip of the target object, the probes are heated by the target object and thus are extended by thermal expansion. Further, a main body of probe card is gradually heated by the heat transferred from the target object to be thermally expanded.

As the inspection on the chips in the target object is repeated, the temperatures of the probe card main body and the probes are gradually raised, so that the tip positions of the probes are gradually displaced from the respective original positions. In that state, if the target object is overdriven by a normal overdrive amount, a probe pressure from the probes excessively increases to thereby inflict damages on the probes or the target object. Further, owing to the displacement of the tip positions, the positions of the probes and the target object are gradually misaligned, so that they are not in tight contact with each other. As a result, the reliability of the inspection may deteriorate.

Therefore, Japanese Patent Laid-open Publication No. 2007-088203 (JP2007-088203A) discloses a method for inspecting a target object to be inspected by preheating a probe card to a temperature close to a temperature of the target object before the inspection. In JP2007-088203A, since the probe card is preheated in a state where the target object heated to a predetermined temperature directly contacts with probes of the probe card, the preheating time can be shortened.

In JP2007-088203A, although the preheating time can be reduced by preheating the probe card in a state where the target object heated to a predetermined temperature is brought into direct contact with the probes of the probe card, the preheating time is still required. Moreover, in this technique, the overdrive amount can be precisely set by correcting only a height of the tip positions of the probes based on a temperature, i.e., a thermal expansion.

However, the probes are extended in a horizontal direction as well as in a height direction, and it is difficult to solve the misalignment in the horizontal direction between the probes and the target object. Besides, depending on types of probe cards, the probes do not properly contact with the electrode pads of the target object, whereby the reliability of the inspection may deteriorate. These drawbacks occur in a low-temperature inspection as well as in a high-temperature inspection.

SUMMARY OF THE INVENTION

In view of the above, the present invention provides an inspecting method for increasing an operating efficiency of a probe apparatus by performing inspection without heating or cooling a probe card in advance and also for performing highly reliable inspection by preventing misalignment between a target object to be inspected and probes and damages to the probe card or the target object, and a storage medium for storing a program of the method.

In accordance with one aspect of the present invention, there is provided an inspecting method for inspecting electrical characteristics of a plurality of chips formed on a target object to be inspected mounted on a mounting table by overdriving the mounting table after making the chips contact with probes of a probe card, the target object being set to a predetermined temperature by heating or cooling.

The inspecting method includes registering a pre-obtained relationship between contact time of the probes with the target object having the predetermined temperature and tip positions of the probes which vary in accordance with the contact time; and inspecting the chips by estimating the tip positions of the probes based on the relationship and the contact time of the probes with the chips upon the inspection and then correcting the tip positions of the probes from previous tip positions based on the estimated values until the probes are stable without being extended or contracted during the inspection.

In accordance with another aspect of the present invention, there is provided an inspecting method for inspecting electrical characteristics of a plurality of chips formed on a target object to be inspected mounted on a mounting table by overdriving the mounting table after making the chips contact with probes of a probe card, the target object being set to a predetermined temperature by heating or cooling, the inspecting method including registering a pre-obtained relationship between contact time of the probes with the target object having the predetermined temperature and tip positions of the probes which vary in accordance with the contact time.

The inspection method further includes a first step of estimating the tip positions of the probes at which a first chip of the target object is inspected based on the relationship and the contact time of the probes with the chip upon inspection and correcting the tip positions from a reference position based on the estimated value; and a second step of inspecting the first chip by horizontally moving the target object to the corrected tip positions of the probes and overdriving the target object by an initial overdrive amount corrected based on the estimated value.

The inspection method further includes a third step of estimating, while aligning the probes to a next chip of the target object, the tip positions of the probes based on the relationship and the contact time of the probes with the next chip upon the inspection and then correcting the tip positions from the positions at which the previous chip has been inspected based on the estimated value; a fourth step of inspecting the next chip after horizontally moving the target object to the corrected positions of the probes and overdriving the target object by a relative overdrive amount corrected based on the estimated value; and repeating the third and the fourth step until the tip positions of the probes become stable.

Preferably, the above inspection methods further include checking the extension or contraction of the probes whenever the inspection on each of the chips is completed.

In accordance with still another aspect of the present invention, there is provided a storage medium storing a program which executes, on a computer, an inspecting method for inspecting electrical characteristics of a plurality of chips formed on a target object to be inspected mounted on a mounting table by overdriving the mounting table after making the chips contact with probes of a probe card, the target object being set to a predetermined temperature by heating or cooling, wherein the storage medium performs by operating the computer.

The program stored in the storage medium executes on the computer registering a pre-obtained relationship between contact time of the probes with the target object having the predetermined temperature and tip positions of the probes which vary in accordance with the contact time; and inspecting the chips by estimating the tip positions of the probes based on the relationship and the contact time of the probes with the chips upon the inspection and then correcting the tip positions of the probes from previous tip positions based on the estimated values until the probes are stable without being extended or contracted during the inspection.

In accordance with still another aspect of the present invention, there is provided a storage medium storing a program which executes, on a computer, an inspecting method inspecting electrical characteristics of a plurality of chips formed on a target object to be inspected mounted on a mounting table by overdriving the mounting table after making the chips contact with probes of a probe card, the target object being set to a predetermined temperature by heating or cooling.

The program stored in the storage medium executes on the computer registering a pre-obtained relationship between contact time of the probes and the target object having the predetermined temperature and tip positions of the probes which vary in accordance with the contact time.

The program stored in the storage medium further executes a first step of estimating the tip positions of the probes at which a first chip of the target object is inspected based on the relationship and the contact time of the probes with the chip upon the inspection and correcting the needle tip positions from a reference position based on the estimated value and a second step of inspecting the first chip by horizontally moving the target object to the corrected tip positions of the probes and overdriving the target object by an initial overdrive amount corrected based on the estimated value.

The program stored in the storage medium further executes: a third step of estimating, while aligning the probes to a next chip of the target object, the tip positions of the probes based on the relationship and the contact time of the probes with the next chip upon the inspection and then correcting the tip positions from the positions at which the previous chip has been inspected based on the estimated value; a fourth step of inspecting the next chip after horizontally moving the target object to the corrected positions of the probes and overdriving the target object by a relative overdrive amount corrected based on the estimated value; and repeating the third and the fourth step until the tip positions of the probes become stable.

The above storage mediums preferably further perform checking the extension of the probes whenever the inspection on the chips is completed.

In accordance with the present invention, there can be provided an inspecting method for increasing an operating rate of a probe apparatus by performing inspection without heating or cooling a probe card in advance and also for performing highly reliable inspection by preventing misalignment between a target object to be inspected and probes and damages to the probe card or the object to be processed, and a storage medium for storing a program of the method.

BRIEF DESCRIPTION OF THE DRAWINGS

The objects and features of the present invention will become apparent from the following description of embodiments, given in conjunction with the accompanying drawings, in which:

FIGS. 3A and 3B provide graphs depicting a relationship between an elapsed time during which probes of a probe card are heated by a wafer having a predetermined temperature and tip positions of the probes, wherein FIG. 3A is a graph showing a relationship between the heating elapsed time and a height of the tip, and FIG. 3B is a graph showing a relationship between the heating elapsed time and a horizontal position of the tip;

DETAILED DESCRIPTION OF THE EMBODIMENT

Embodiments of the present invention will be described with reference to FIGS. 1 to 5 which form a part hereof.

Hereinafter, a probe apparatus to which an inspecting method of this embodiment is applied will be explained with reference to FIGS. 1 and 2.

Figure 1:
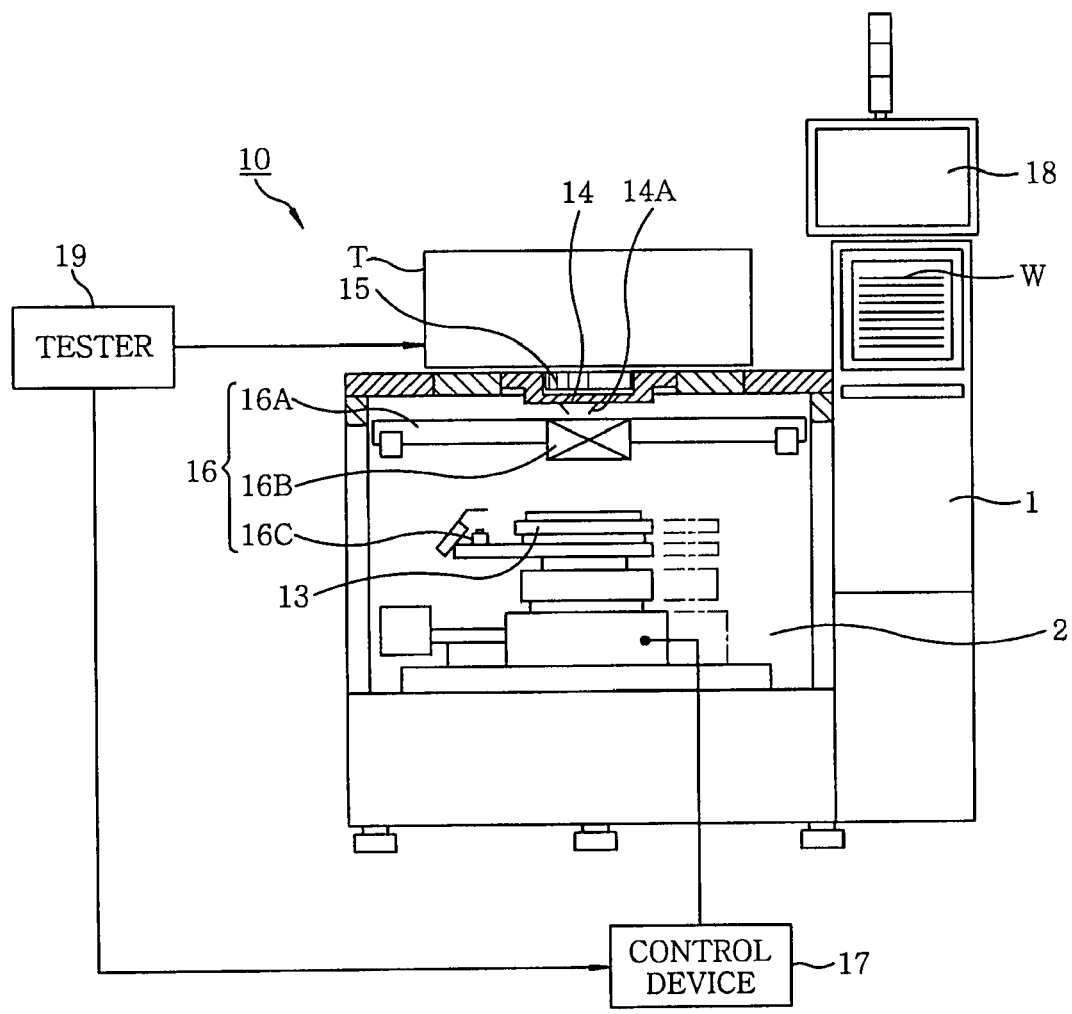
FIG. 1 shows a partial cutaway cross sectional view of an example of a probe apparatus to which an inspecting method of the present invention is applied.

As shown in FIG. 1, a probe apparatus 10 includes: a loading unit 11 for transferring a wafer W as a target object to be inspected; and a prober chamber 12 provided near the loading unit 11 for inspecting electrical characteristics of the wafer W from the loading unit 11. The prober chamber 12 has: a mounting table 13 for mounting thereon the wafer W and moving in X, Y, Z and θ directions; a probe card 14 disposed above the mounting table 13; a test head T to be electrically contacted with the probe card 14 via an insert ring 15; an alignment mechanism 16 for aligning a plurality of probes 14A of the probe card 14 with the wafer W mounted on the mounting table 13; and a control device 17 mainly including a computer for controlling various components including the mounting table 13 and the alignment mechanism 16.

The alignment mechanism 16 is driven, under the control of the control device 17, to align the wafer W mounted on the mounting table 13 with the probes 14A of the probe card 14. Next, the probes 14A are brought into electrical contact with the wafer W, thereby inspecting electrical characteristics of the wafer W. The mounting table 13 has therein a temperature control unit 13A. The temperature control unit 13A is driven, under the control of the control device 17, to heat or cool the wafer W mounted on the mounting table 13 to a predetermined inspection temperature.

The alignment mechanism 16 has an alignment bridge 16A moving horizontally between a rear surface of the prober chamber 12 and a probe center, a first CCD camera 16B provided at the alignment bridge 16A, and a second CCD camera 16C disposed at a side of the mounting table 13. Further, the alignment mechanism 16 aligns the probe card 14 with the wafer W mounted on the mounting table 13. The first CCD camera 16B moves from the rear surface of the prober chamber 12 to the probe center with the alignment bridge 16A, and then is positioned between the probe card 14 and the mounting table 13. In that position, the first CCD camera 16B detects electrode pads of the wafer W from above while the mounting table 13 is moving in X and Y directions. After the alignment bridge 16A retreats to the rear surface of the prober chamber 12, the second CCD camera 16C sequentially detects the probes 14A from below the probe card 14 while the mounting table 13 is moving in X and Y directions below the probe card 14.

Figure 2:
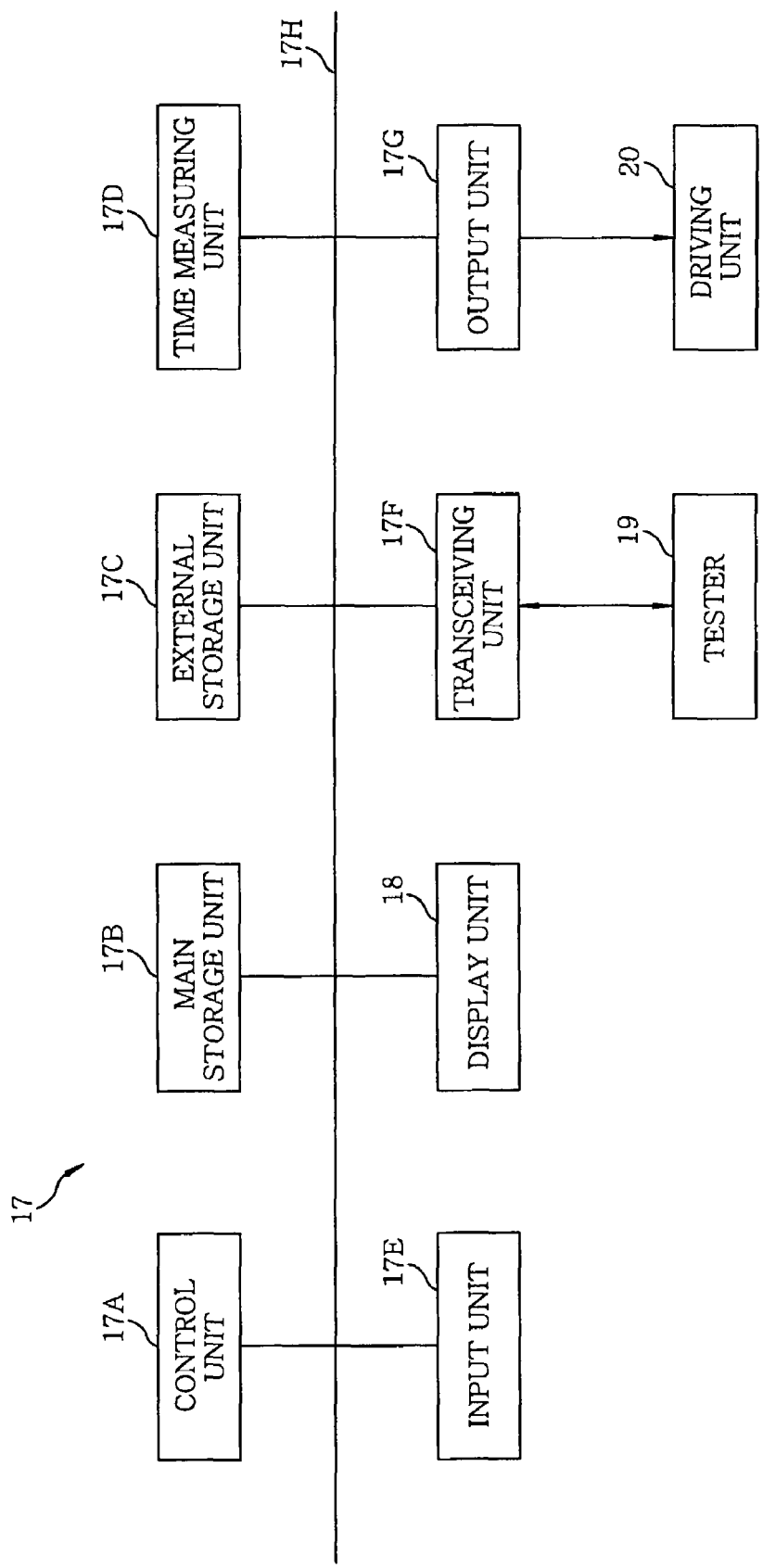
FIG. 2 is a block diagram illustrating a configuration of a control unit of the probe apparatus in FIG. 1.

As illustrated in FIG. 2, the control device 17 has a control unit 17A, a main storage unit 17B, an external storage unit 17C, a time measuring unit 17D, an input unit 17E, a transceiving unit 17F and an output unit 17G, all being connected to each other via a bus 17H. Further, the control device 17 is connected to a display unit 18, and the display unit 18 displays thereon, for example, various data input from the input unit 17E and image data such as captured images of the first and the second CCD camera 16B and 16C through the control device 17. As for the control device 17 and the display unit 18, conventionally known ones can be used.

The control unit 17A mainly having a CPU or the like executes in the main storage unit 17B various programs including a program for executing an inspecting method of the present invention which is stored in the external storage unit 17C, and also performs various processes by operating various devices such as the mounting table 13 and the like. Further, the external storage unit 17C stores therein results of various processes performed by the control unit 17A.

The time measuring unit 17D has a crystal oscillator, a clock and a counter for counting a clock pulse oscillated by the crystal oscillator. The time measuring unit 17D operates as a timer at a specific time in accordance with an instruction of the control unit 17A, and provides present time to the control unit 17A. For example, once the control unit 17A sets the counter of the time measuring unit 17D to have a predetermined value and starts the timer, the time measuring unit 17D subtracts 1 from the counter value whenever the clock pulse is generated. When the counter value becomes 0, the time measuring unit 17D issues an interrupt signal to the control unit 17A, so that the control unit 17A can measure a specific inspection time or the like. Further, the clock of the time measuring unit 17D counts the clock pulse from a reference time, and the control unit 17A can check the present time, i.e., the time lapse from the reference time, by reading the count value from the time measuring unit 17D. Moreover, the control unit 17A receives the inspection result of the wafer W by sending/receiving various signals to/from a tester 19 via the transcieving unit 17F. The output unit 17G controls a driving unit 20, such as the mounting table 13 or the like, based on the instruction signal of the control unit 17A.

As set forth above, the external storage unit 17C of the controller 17 stores therein the program for executing the inspecting method of the present invention and various data used for executing the corresponding program. For example, when the inspecting method of the present invention is performed in a state where the wafer W is heated to a predetermined high temperature (e.g., about 100° C.), there is obtained in advance a relationship between an elapsed time during which the probe card 14 is heated by contacting with wafer W of about 100° C. and tip positions of the probes 14A which are displaced as the time elapses, and the relationship thus obtained is stored in the external storage unit 17C.

Figure 3A:
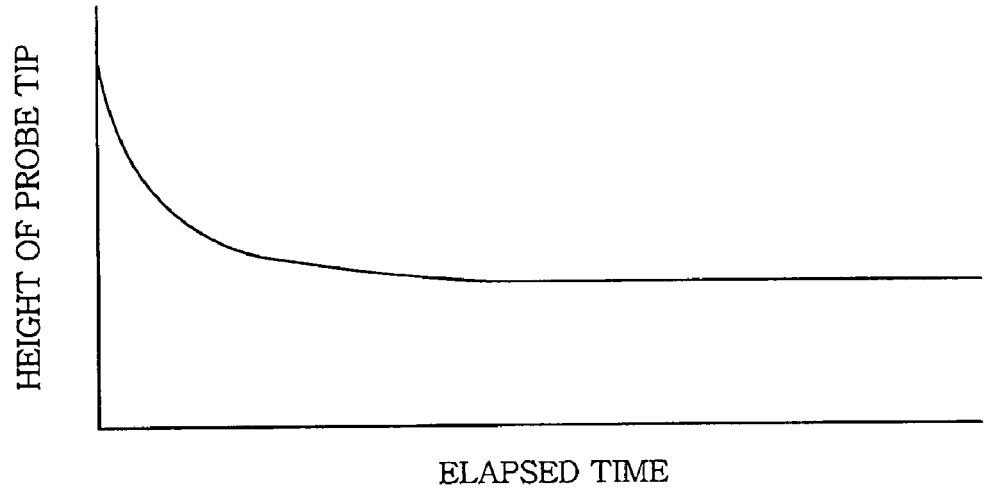
Figure 3B:
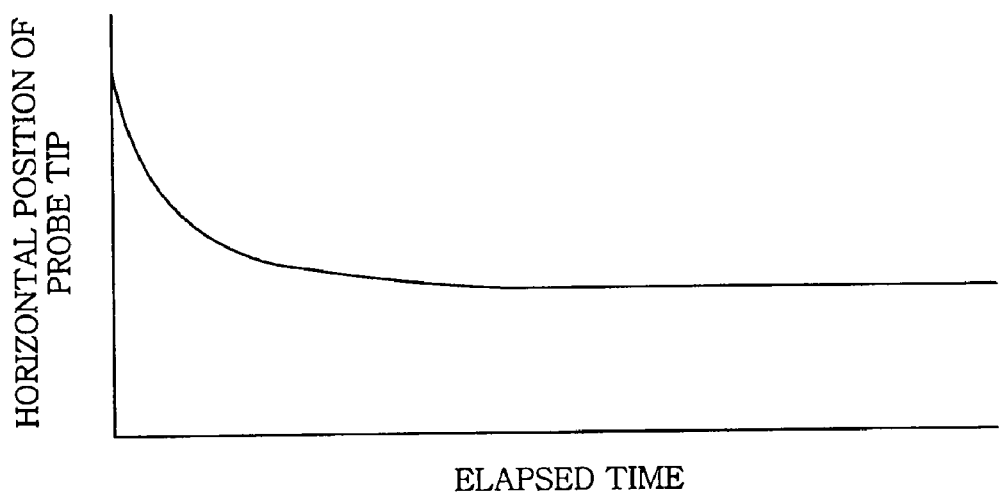

FIG. 3A is a graph showing a relationship between the elapsed time and the height of the tip position estimated by the extension of the probes 14A, and FIG. 3B is a graph showing a relationship between the elapsed time and the horizontal position of the tip. As clearly can be seen from FIGS. 3A and 3B, although the tip positions of the probes 14A are greatly displaced in an initial stage of the heating operation, the displacement gradually decreases thereafter. As a result, the probe card 14 becomes thermally stable, and the tip positions are not substantially displaced. The meaning of "substantially" is that the displacement hardly affects the inspection.

The tip positions of the probes 14A are gradually displaced by the extension of the probes 14A and the thermal expansion of the probe card main body 14B. When each of the chips of the wafer W is inspected at a high temperature and the probes 14A are thermally expanded by the heating, the tip positions of the probes 14A (horizontal position and height) thermally expanded by the contact with the wafer W are estimated by using the aforementioned relationship. Hereinafter, an embodiment of the inspecting method of the present invention will be described with reference to FIGS. 3A to 5.

Figure 4A:
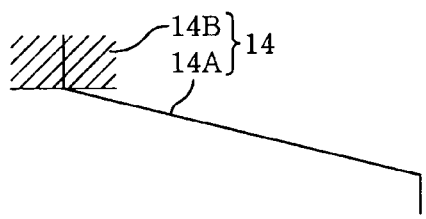
FIGS. 4A to 4D explain variation in the tip positions of the probe of the probe card in accordance with the heating elapsed time.
Figure 4B:
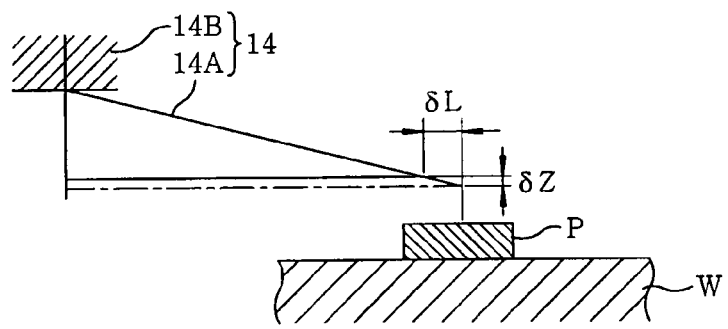

FIGS. 4A to 4D present cross sectional views respectively showing a displacement of the tip position of the gradually heated probe 14A and a state where an electrode pad P is brought into contact with the displacing probe 14A. FIG. 4A shows the probe 14A of the probe card 14 which is not yet heated by the wafer W mounted on the mounting table 13. The tip position at that time becomes a reference position of the probe 14A. When the probe 14A is brought into contact with the electrode pad P of the first chip of the wafer W by the start of the high-temperature inspection as shown in FIG. 4B, the probe 14A is initially heated by the wafer W, and thus is extended by thermal expansion during the inspection time. At the same time, the probe card main body 14B is thermally expanded. Accordingly, the horizontal position and the height of the tip are respectively displaced by $\delta L$ and $\delta Z$ from the reference position shown in FIG. 4A. If the inspection is carried out after the thermal expansion is completed, the throughput would not be improved.

In the embodiment of the present invention, since the relationship between the heating elapsed time (referred to also as "contact time") during which the probe 14A heated by contacting with the wafer W and the tip position of the probe 14A is obtained in advance as shown in FIGS. 3A and 3B, the tip position of the probe 14A being in contact with the first chip (heated to a high temperature of about 100° C.) is estimated by using the relationship and the needle tip position of the probe 14A is corrected from the reference position shown in FIG. 4A to the position shown in FIG. 4B, based on the estimated value. Specifically, the position of the electrode pad P of the wafer W is corrected by $\delta L$ in a horizontal direction, and an initial overdrive amount (OD amount) in that position is reduced by $\delta Z$ compared to the originally required OD amount. The control device 17 controls the mounting table 13 in accordance with the corrected tip position.

Figure 4C:
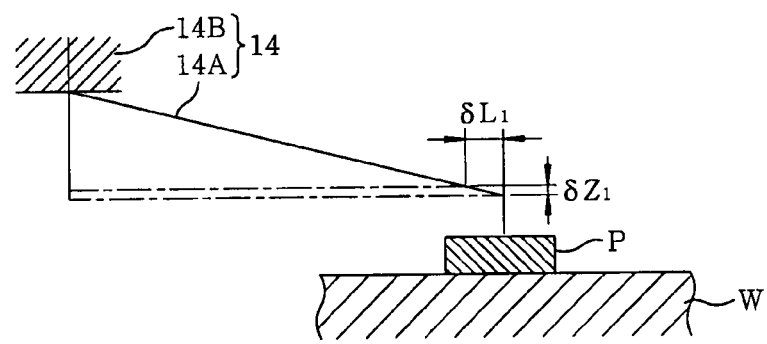

After the inspection on the first chip P is completed, the wafer W is index-fed through the mounting table 13 and, then, the inspection on a second chip P is carried out. During the index feeding, the wafer W is separated from the probe 14A, so that the temperature of the probe 14A slightly decreases. Therefore, in the embodiment of the present invention, the tip position of the probe 14A at which the second chip P is inspected is estimated by referring to FIGS. 3A and 3B with consideration of the decrement. The decrement is negligible in some cases. For example, the height and the horizontal position of the tip are respectively corrected by $\delta Z_1$ and $\delta L_1$ from those shown in FIG. 4B based on the estimated values, as shown in FIG. 4C. In that case, the OD amount is reduced by $\delta Z_1$ from the originally required OD amount.

Figure 4D:
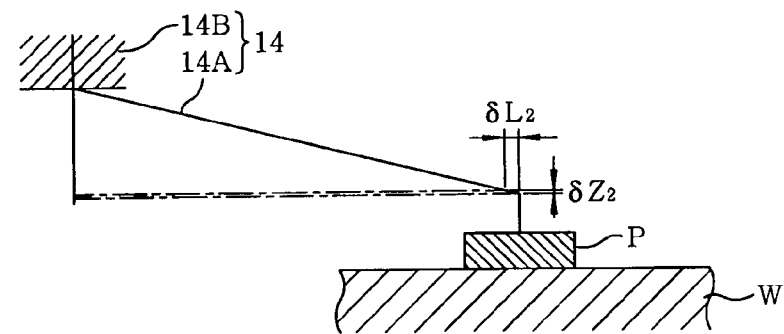

When a third chip P is inspected, the height and the horizontal position of the tip of the probe 14A are respectively corrected by $\delta Z_2$ and $\delta L_2$ from those shown in FIG. 4C, as illustrated in FIG. 4D. In that case, the OD amount is reduced by $\delta Z_2$ from the originally required OD amount. While the index feeding is repeated, the tip position of the probe 14A becomes stable, and the effects of the thermal expansion are disappeared. After the effects of the thermal expansion are disappeared, the tip position need not be corrected. Therefore, the inspection is performed at a previous tip position, and the originally required OD amount is maintained.

Hereinafter, a case where the inspecting method is performed by using a storage medium storing a program of the embodiment of the present invention will be described with reference to FIG. 5.

Figure 5:
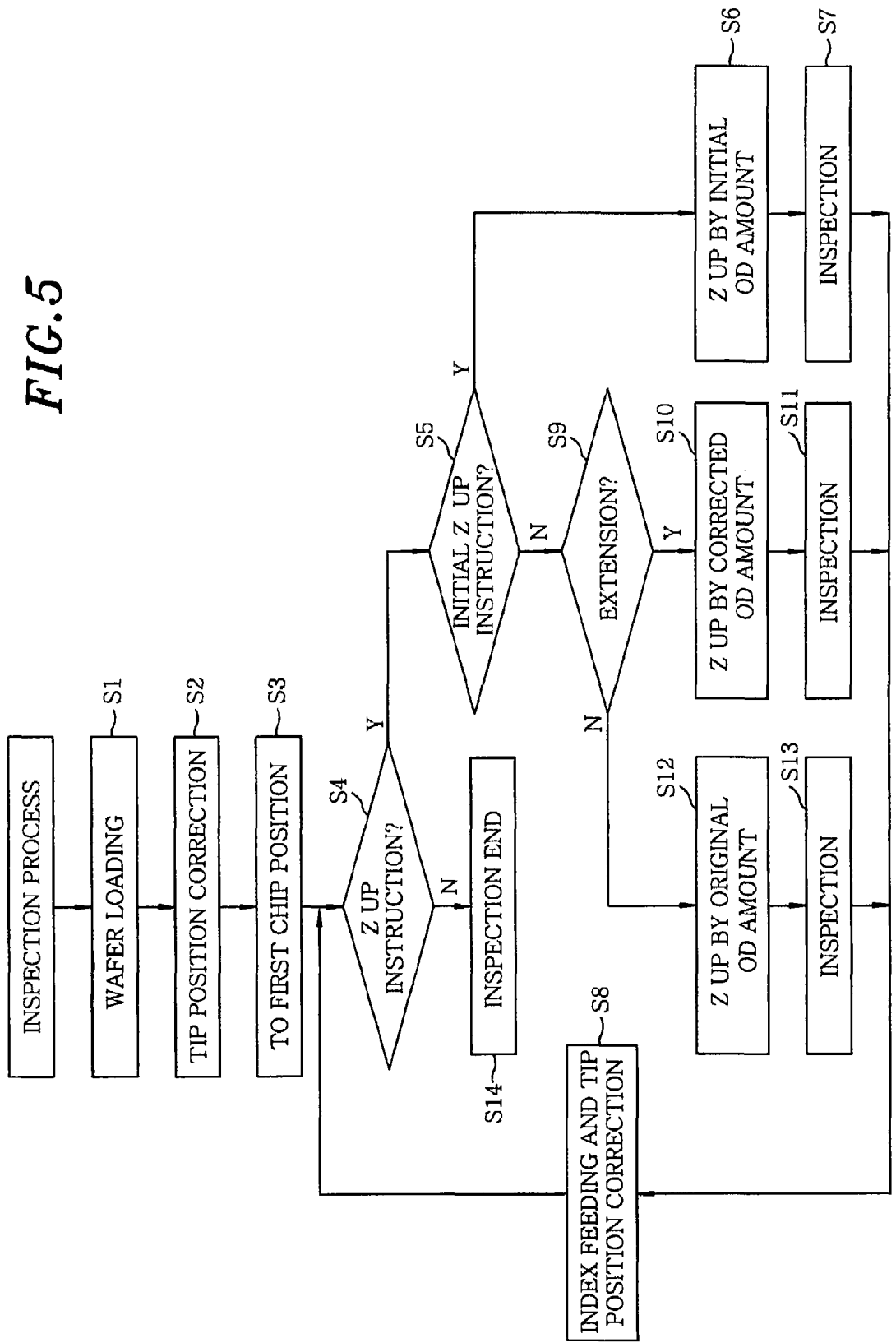
FIG. 5 offers a flow chart of the inspecting method in accordance with an embodiment of the present invention.

When the inspection is started, the wafer W from the loading unit 11 is mounted on the mounting table 13 in the prober chamber 12 (step S1), as shown in FIG. 5. Next, the electrode pads P of the wafer W are aligned with the probe card 14 and, then, the tip positions of the probes 14A are estimated based on the relationship between the contact time of the probe 14A and the tip position of the probe 14A, the relationship being stored in the external storage unit 17D. Thereafter, the moving amount of the mounting table 13 is corrected from the reference position shown in FIG. 4A (step S2). The mounting table 13 is moved horizontally to the position of the first chip P (see, FIG. 4B) based on the correction value, and then is positioned directly under a predetermined probe (step S3).

Next, the control device 17 checks whether or not a Z up instruction is received from the tester 19 (step S4). If the control device 17 determines that the Z up instruction is received from the tester 19, it is checked whether the Z up instruction is initial or not (step S5). If it is determined to be initial, the mounting table 13 is moved up, so that the first chip P of the wafer W is made to have a contact with the probes 14A and move up by the initial OD amount (smaller by $\delta Z$ than the original OD amount) (step S6). In this way, the probes 14A are brought into an electrical contact with the electrode pads P, thereby inspecting electrical characteristics of the chip P based on the signal from the tester (step S7). At this time, the inspection time is measured by the time measuring unit 17E of the control device 17. Since the wafer W is overdriven by the amount smaller than the original overdrive amount by considering the extension of the probes 14A, it is possible to prevent the probes 14A or the wafer W from being damaged.

After the inspection on the first chip P is completed, the wafer W is index-fed through the mounting table 13 under the control of the control device 17 (step S8). During the index feeding, the control device 17 estimates the tip positions of the probes 14A to be in contact with a second chip P based on the relationship, and the second chip P is positioned directly under the probes 14A by correcting the horizontal movement amount of the mounting table 13 based on the estimated value. While the wafer W is index-fed, the temperature of the probes 14A decreases slightly. The time measuring unit 17E of the control device 17 counts the index feeding time from when the wafer W is separated from the probes 14A. The decrement is calculated by estimating the decreased temperature based on the index feeding time and the temperature of the probes 14A at the separation moment (which is assumed to be the same as the temperature of the wafer W). The horizontal movement amount of the mounting table 13 is corrected based on the relationship between the calculated value and the tip of the probe 14A and, then, the second chip P is positioned directly under the probes.

After the second chip P is positioned directly under the probes 14A, if the Z up instruction from the tester 19 is confirmed by the control device 17 in step S4 and if it is determined in step S5 that the Z up instruction is not a first one, it is checked whether or not the probe 14A is extended (step S9). If the probe 14A is determined that it has been extended, the mounting table 13 is moved up so that the second chip P contacts with the probes 14A and is then Z-upped by the relative OD amount (smaller by $\delta Z_1$ than the original OD amount) (step S10). Then, the second chip P is inspected (step S11). Next, the wafer W is index-fed through the mounting table 13, and a third chip P is inspected by the same steps applied to the second chip P.

While the index feeding is repeated, the probe card 14 is thermally expanded and becomes stable, so that the tip positions of the probes 14A hardly change. When the probes 14A are completely extended until their dimensions become stable, it is determined in step S9 by the control device 17 that the probes 14A are not extended any more. After the chip P contacts with the probe 14A, the wafer W is Z-upped by the originally required OD amount (step S12), and the corresponding chip P is inspected (step S13). Thereafter, all the chips are inspected at the same OD amount, and the inspection is repeated until the final chip is inspected. When the inspection on the final chip is completed, it is determined in step S4 by the control device 17 that there exists no Z up instruction, and the inspection is completed (step S14).

In accordance with the embodiment of the present invention, a plurality of chips P is inspected simultaneously. However, the chips can be inspected one by one.

As described above, in accordance with the embodiment, the inspection is performed while correcting the tip positions of the probes 14A whenever the inspection on the chip P is carried out. Therefore, the preheating of the probe card 14 can be omitted, thereby improving a throughput and increasing an operating efficiency of the probe apparatus. At the same time, the reliability of the inspection can be improved by preventing the misalignment between the probes and the chips P of the wafer W and the damages to the probes 14A and/or the wafer W.

In the aforementioned embodiment, the high-temperature inspection on the wafer W has been described as an example. However, the embodiment of the present invention can also be applied to the low-temperature inspection on the wafer. Moreover, although a wafer is used as an example of a target object to be inspected in the above embodiment, it is also possible to use a glass substrate for use in a liquid crystal display.

The present invention can be appropriately applied to a probe apparatus for inspecting electrical characteristics of an object to be inspected such as a semiconductor wafer or the like.

While the invention has been shown and described with respect to the embodiments, it will be understood by those skilled in the art that various changes and modification may be made without departing from the scope of the invention as defined in the following claims.

What is claimed is:

1. An inspecting method for inspecting electrical characteristics of a plurality of chips formed on a target object to be inspected mounted on a mounting table by overdriving the mounting table after making the chips contact with probes of a probe card, the target object being set to a predetermined temperature by heating or cooling, the inspecting method comprising:

registering a pre-obtained relationship between contact time of the probes with the target object having the predetermined temperature and tip positions of the probes which vary in accordance with the contact time; and inspecting one or more chips at a time by estimating the tip positions of the probes based on the relationship and the contact time of the probes with said one or more chips and then correcting the tip positions of the probes from previous tip positions based on the estimated tip positions until the probes are stable without being extended or contracted.

2. The inspecting method of claim 1, further comprising checking the extension or contraction of the probes whenever the inspection on each of the chips is completed.

3. An inspecting method for inspecting electrical characteristics of a plurality of chips formed on a target object to be inspected mounted on a mounting table by overdriving the mounting table after making the chips contact with probes of a probe card, the target object being set to a predetermined temperature by heating or cooling, the inspecting method comprising the sequential steps of:

a) registering a pre-obtained relationship between contact time of the probes with the target object having the predetermined temperature and tip positions of the probes which vary in accordance with the contact time;

b) estimating the tip positions of the probes based on the relationship and the contact time of the probes with first one or more chips and correcting the tip positions from reference positions based on the estimated tip positions;

c) inspecting the first chips by horizontally moving the target object to the corrected tip positions of the probes and overdriving the target object by an initial overdrive amount corrected based on the estimated tip positions;

d) estimating, while aligning the probes to next one or more chips of the target object, the tip positions of the probes based on the relationship and the contact time of the probes with the next chips and then correcting the tip positions from the previous tip positions for the chips previously inspected based on the newly estimated tip positions;

e) inspecting the next chips after horizontally moving the target object to the newly corrected tip positions of the probes and overdriving the target object by a relative overdrive amount corrected based on the newly estimated tip positions; and f) repeating steps d) and e) until the tip positions of the probes become stable.

4. The inspecting method of claim 3, further comprising checking the extension or contraction of the probes whenever the inspection on each of the chips is completed.

5. A computer readable storage medium having stored thereon a program which is a set of instructions which when executed on a computer, cause the computer to perform an inspecting method for inspecting electrical characteristics of a plurality of chips formed on a target object to be inspected mounted on a mounting table by overdriving the mounting table after making the chips contact with probes of a probe card, the target object being set to a predetermined temperature by heating or cooling, wherein the inspecting method comprises:

registering a pre-obtained relationship between contact time of the probes with the target object having the predetermined temperature and tip positions of the probes which vary in accordance with the contact time; and inspecting one or more chips at a time by estimating the tip positions of the probes based on the relationship and the contact time of the probes with said one or more chips and then correcting the tip positions of the probes from previous tip positions based on the estimated tip positions until the probes are stable without being extended or contracted.

6. The computer readable storage medium of claim 5, wherein the extension or contraction of the probes is checked whenever the inspection on each of the chips is completed.

7. A computer readable storage medium having stored thereon a program which is a set of instructions which when executed on a computer, cause the computer to perform an inspecting method for inspecting electrical characteristics of a plurality of chips formed on a target object to be inspected mounted on a mounting table by overdriving the mounting table after making the chips contact with probes of a probe card, the target object being set to a predetermined temperature by heating or cooling, the inspecting method comprising, the sequential steps of:

a) registering a pre-obtained relationship between contact time of the probes with the target object having the predetermined temperature and tip positions of the probes which vary in accordance with the contact time;

b) estimating the tip positions of the probes based on the relationship and the contact time of the probes with first one or more chips and correcting the tip positions from reference positions based on the estimated tip positions;

c) inspecting the first chips by horizontally moving the target object to the corrected tip positions of the probes and overdriving the target object by an initial overdrive amount corrected based on the estimated tip positions;

d) estimating, while aligning the probes to next one or more chips of the target object, the tip positions of the probes based on the relationship and the contact time of the probes with the next chips and then correcting the tip positions from the previous tip positions for the chips previously inspected based on the newly estimated tip positions;

e) inspecting the next chips after horizontally moving the target object to the newly corrected tip positions of the probes and overdriving the target object by a relative overdrive amount corrected based on the newly estimated tip positions; and f) repeating steps d) and e) until the tip positions of the probes become stable.

8. The computer readable storage medium of claim 6, wherein the extension or contraction of the probes is checked whenever the inspection on each of the chips is completed.

\* \* \* \* \*